(12) United States Patent
Seon

(10) Patent No.: US 6,248,220 B1
(45) Date of Patent: Jun. 19, 2001

(54) RADIO FREQUENCY SPUTTERING APPARATUS AND FILM FORMATION METHOD USING SAME

(75) Inventor: Jeong-Min Seon, Jangsung-Kun (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/270,826

(22) Filed: Mar. 18, 1999

(30) Foreign Application Priority Data

Dec. 4, 1998 (KR) .................................................. 98/53131

(51) Int. Cl.[7] .................................................. C23C 14/34
(52) U.S. Cl. .............................. 204/192.12; 204/192.17; 204/198; 251/193
(58) Field of Search .................................... 204/192, 298, 204/198; 505/475, 476, 731; 118/723, 728; 427/578; 438/676; 251/193, 187, 129.01, 195

(56) References Cited

U.S. PATENT DOCUMENTS

| | | | |
|---|---|---|---|
| Re. 30,401 | * 9/1980 | White | 204/192 |
| 3,767,551 | * 10/1973 | Lang et al. | 204/192 |
| 4,039,416 | * 8/1977 | White | 204/192 |
| 4,131,533 | * 12/1978 | Bialko et al. | 204/298 |
| 4,362,611 | * 12/1982 | Logan et al. | 204/298 |
| 4,828,668 | * 5/1989 | Yamazaki et al. | 204/298 |
| 5,078,847 | * 1/1992 | Grosman et al. | 204/192 |
| 5,653,812 | * 8/1997 | Petrmichl et al. | 118/723 |
| 5,667,650 | * 9/1997 | Face et al. | 204/298 |
| 5,683,072 | * 11/1997 | Ohmi et al. | 251/193 |
| 5,879,523 | * 3/1999 | Wang et al. | 204/298 |
| 5,976,334 | * 11/1999 | Fu et al. | 204/298 |
| 5,985,102 | * 11/1999 | Leipart | 204/192 |
| 6,077,403 | * 6/2000 | Kobayashi et al. | 204/192 |

OTHER PUBLICATIONS

C.S. Ma et al. "The Role of Ambient Gas Scattering Effect and Lead Oxide Formation In Pulsed Laser Deposition of Lead–Zirconate–Titanate Thin Films" Appl. Phys. Lett. 69, Sep. 30, 1996, pp. 2030–2032.

Jun–Hao et al. "Study of the Resputtering Effect During rf–Sputter Deposition of TBCO Films" J. Mater. Res., vol. 10, No. 4, Apr. 1995, pp. 798–801.

\* cited by examiner

*Primary Examiner*—Charles Bowers
*Assistant Examiner*—Laura M Schilly
(74) *Attorney, Agent, or Firm*—Fleshner & Kim, LLP

(57) ABSTRACT

A radio frequency sputtering apparatus and a film forming method using the same are disclosed. The method includes the steps of floating a shield adjacent to the substrate, applying an RF power to the substrate as well as the target to induce a self-bias voltage to the target and the substrate, and restricting a plasma discharge region in accordance with the ionization of a process gas to an adjacency to the target, thereby decreasing the bombarding of the film on the wafer by positive ions of the plasma and negative ions from the target.

18 Claims, 2 Drawing Sheets

RADIO FREQUENCY SPUTTERING APPARATUS AND FILM FORMATION METHOD USING SAME

BACKGROUND OF THE INVENTION

1. Field of the Invention

The present invention relates to a physical vapor deposition, and more particularly, to an RF (radio frequency) sputtering sputtering apparatus and a film formation method using the same, capable of appropriately improving quality of a film being deposited on a wafer.

2. Description of the Background Art

The forming method of a film on a wafer may vary to a chemical method in which a gaseous material is synthesized via a chemical reaction into a solid material in form of a film or particles, and a physical method in which target particles are deposited on a wafer using a variety of physical technologies.

The chemical method includes a chemical vapor deposition (CVD) and a plating, and the physical method includes a sputtering, evaporation and spin coating.

FIG. 1 is a schematic construction view illustrating a conventional sputtering apparatus. As shown therein, the sputtering apparatus includes a substrate 16 mounted thereon by a wafer W, a chamber 14 including a target 18 (cathode) serving as a deposition material and separated from an exterior thereof, a gas supply unit 24 providing gas into the chamber 14, a power supply unit 22 providing an RF power to respective sections, and a vacuum unit 30 vaccumizing the chamber 14.

The target 18 is formed of one selected from a ceramic material, metal compound and insulation material. Argon gas ($ArO_2$) is used for the gas.

The RF power supplied from the RF power supply unit 22 is provided to the target 18 via the cable 26 and a matching network 28.

Reference numeral 32 denotes an ion sheath, and 34 denotes a base plate, respectively.

According to the conventional film forming method using the apparatus in FIG. 1, gas is supplied between the target 18 and the substrate 16 under a vacuum state. When the RF power is applied to the target 18, the gas becomes ionized by a glow discharge so that a plasma discharge occurs between the target 18 and the substrate 16. The positive-charged ions which exist in the discharge region become striking the surface of the target 18 by an electrical power, whereas atoms or molecules sputtered from the target 18 become deposited on the wafer W facing thereagainst.

FIGS. 2A and 2B are graphs illustrating the substrate, the target and plasma potentials during a film forming process using the apparatus in FIG. 1. With reference to the drawings, their inter-electrical relation and bombarding phenomenon will now be described.

As shown in FIG. 2A, when using argon+oxygen gas ($Ar+O_2$) as a process gas, the positive-charged ions ($Ar^+$) within the plasma continues its acceleration toward the target in accordance with an electrical force caused by a potential difference (Vp>Vt) of a target potential Vt and a plasma potential $V_p$, thereby striking the target surface. The atoms sputtered from the target by the strike of the positive-charged ions are deposited on the wafer. However, some of the positive ions within the plasma become accelerated toward the substrate during the deposition by an electrical force caused by a potential difference (Vp>Vs) of the plasma potential Vp and the substrate potential Vs, thereby eventually bombarding the film on the wafer.

Referring to FIG. 2B, when argon gas is used as a process gas, a negative dc self-bias voltage Vdc is induced to the target, so that a plasma potential is decreased, thereby decreasing the bombarding of the positive ions within the plasma onto the substrate surface. In the meantime, the negative ions ($O^-$) sputtered from the target become accelerated by the voltage Vdc induced to the target, thereby bombarding the film deposited on the wafer.

The conventional film formation method as described above has a disadvantage in that the film deposited by a sputtering method becomes bombarded by both the positive ions within the plasma and the negative ions sputtered from the target for thereby incurring a resputtering phenomenon in the film itself.

Further, when the film is formed on the substrate using a ceramic material as a target, the composition of the ceramic film deposited on the substrate becomes different from that of the source target due to the different sputtering yield among the respective components incorporating the ceramic material, thereby making it difficult to control the composition of the film being deposited on the substrate.

Still further, an electrical crystalline film characteristic of the film deposited on the substrate may be significantly deteriorated by the bombarding which results from both the positive ions within the plasma and the negative ions sputtered from the target.

SUMMARY OF THE INVENTION

The present invention is directed to overcoming the conventional disadvantages.

Accordingly, it is an object of the present invention to provide a sputtering apparatus and film formation method using the same which is capable of decreasing the bombarding of both positive ions within a plasma region and negative ions from a target onto a film deposited on a wafer, by applying an identical RF power to the substrate and the target, thereby improving quality of the film.

To achieve the above-described object, there is provided an RF sputtering apparatus according to the present invention which includes a chamber for proceeding a sputtering process therein to form a film, a substrate disposed in a lower portion of the chamber and mounted thereon by a wafer, a target disposed in an upper portion of the chamber and facing against the substrate, upper and lower shields disposed adjacent to the substrate and the target, a gas supply unit for supplying a reaction gas into the chamber, a power supply unit for applying the RF power to the upper and lower shields, the substrate and the target, and a vacuum unit for vaccumizing an interior of the chamber.

Further, to achieve the above-described object, there is provided an RF sputtering apparatus according to the present invention provided with a vacuum chamber, a target mounted within the chamber and serving as a deposition object, a substrate facing against the target and mounted thereon by a wafer, a gas supply unit providing a process gas into the chamber, and a power supply unit providing an RF power, which includes the steps of floating a shield adjacent to the substrate, applying an RF power to the substrate as well as the target to induce a self-bias voltage to the target and the substrate, and restricting a plasma discharge region in accordance with the ionization of a process gas to an adjacency to the target.

The object and advantages of the present invention will become more readily apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

With reference to the accompanying drawings, the RF sputtering apparatus and film formation method using the same will now be described.

Figure 1:
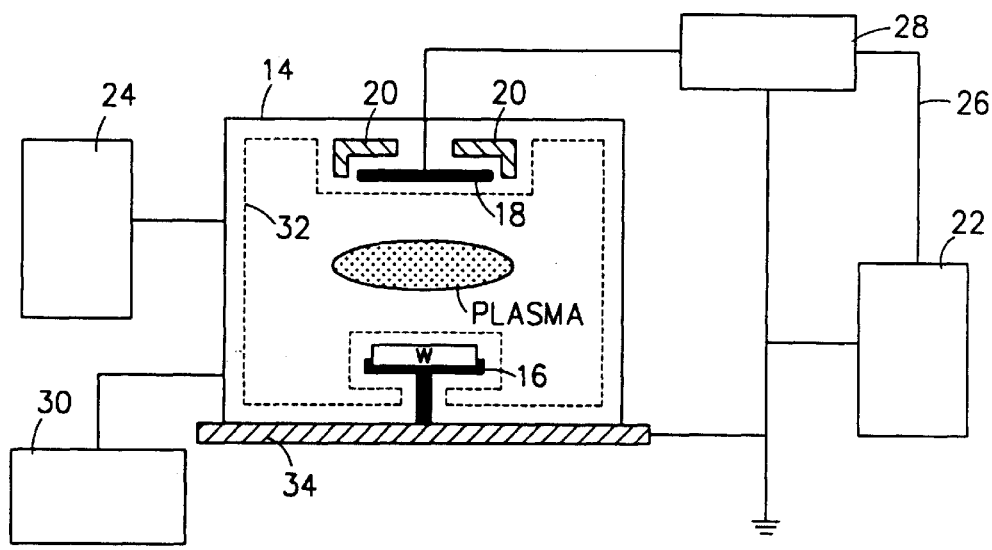
FIG. 1 is a schematic construction view illustrating a conventional RF sputtering apparatus.
Figure 2A:
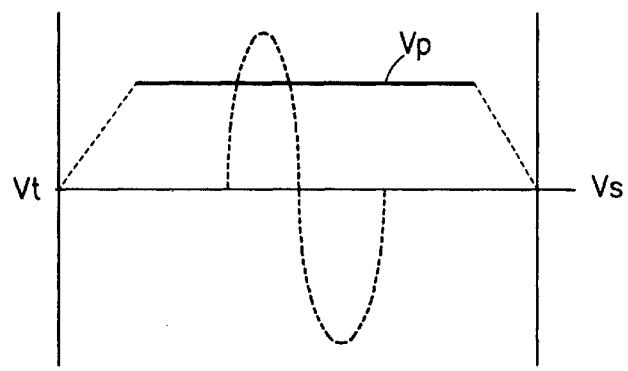
FIG. 2A is a graph illustrating a substrate, a target and a voltage applied to plasma during a film forming process by use of the apparatus in FIG. 1, in case a self-bias direct voltage is not applied to the target.
Figure 2B:
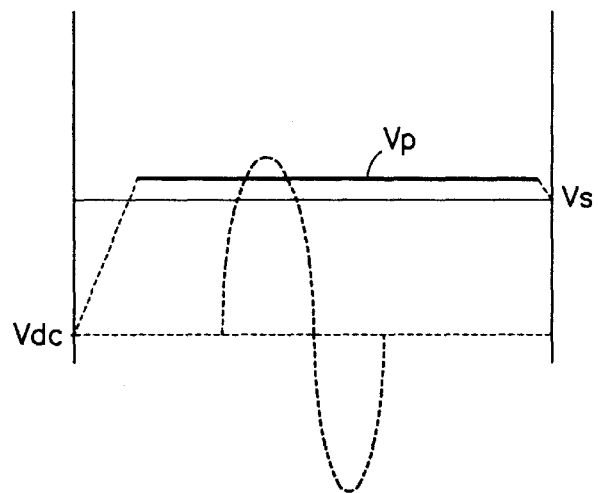
FIG. 2B is a graph illustrating a substrate, a target and a voltage applied to plasma during a film forming process by use of the apparatus in FIG. 1, in case a self-bias direct voltage is applied to the target.
Figure 3:
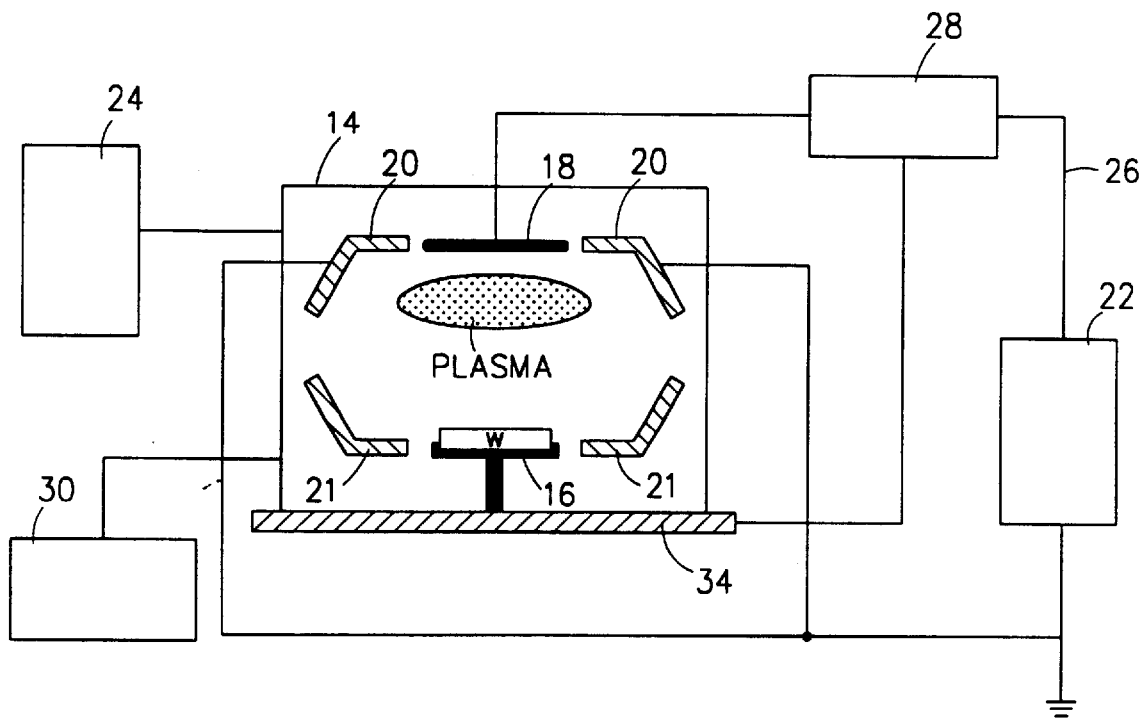
FIG. 3 is a schematic construction view illustrating an RF sputtering apparatus according to the present invention.

FIG. 3 is a schematic construction view illustrating an RF sputtering apparatus according to the present invention, wherein the same reference numerals are assigned to its elements identical to those in FIG. 1.

As shown therein, the sputtering apparatus according to the present invention includes a substrate 16 mounted thereon by a wafer W, a chamber 14 including a target 18 (cathode) serving as a deposition material and separated from an exterior, a gas supply unit 24 providing gas into the chamber 14, a power supply unit 22 providing an RF power to respective sections, and a vacuum unit 30 vaccumizing the chamber 14. The target 18 is formed of one selected from ceramic material, metal compound and insulation material. Here, argon+oxygen gas ($Ar+O_2$) are used for the gas.

The RF power supplied from the RF power supply unit 22 is provided to the target 18 and the substrate 16 at the same time via the cable 26 and a matching network 28.

Reference numerals 20 and 21 are ion shields, respectively, and 34 denotes a base plate.

According to the film forming method using the apparatus in FIG. 3, the shield 20 adjacent to the target 18 is grounded, and the shield 21 adjacent to the substrate 16 is floated. Then, gas is supplied between the target 18 and the substrate 16 under a vacuum state. When the RF power is applied to the target 18 and the substrate 16, the gas becomes ionized in accordance with the glow discharge and accordingly a plasma discharge occurs around the target 18. The positive-charged ions which exist in the discharge region become striking the surface of the target 18 by an electrical power Vdc1, whereas atoms sputtered from the target 18 become deposited on the wafer W facing thereagainst.

Figure 4:
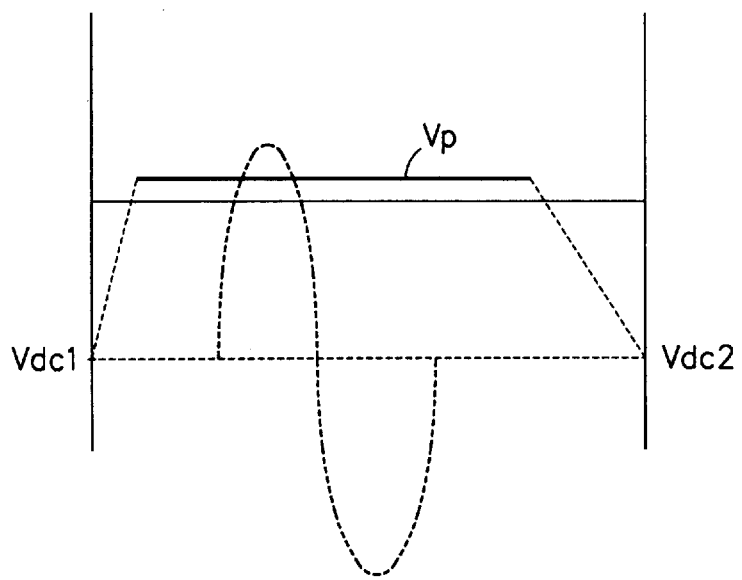
FIG. 4 is a graph illustrating a substrate, a target and a voltage applied to plasma during a film forming process by use of the apparatus in FIG. 3.

FIG. 4 is a graph illustrating the substrate, the target and plasma potentials during a film forming process using the apparatus in FIG. 3. With reference to the drawing, their inter-electrical relation and bombarding phenomenon will now be explained.

As shown in FIG. 4, the negative ions sputtered from and accelerated by the negative self-bias voltage Vdc2 induced to the target move toward the substrate but lose their energy by the negative self-bias voltage Vdc2 induced to the substrate, thereby failing to bombard the film on the wafer. However, when the Vdc2 is induced to the substrate, the negative ions are retarded by the potential barrier Vdc2 but the positive ions are accelerated thereto. Since the plasma ions are randomly diffused from the plasma discharge region, the plasma density near the substrate is low. Accordingly, a thick sheath is formed due to the Vdc so that the plasma ions become losing energy by the collision with the gases while being dragged, thereby making it difficult to obtain more energy than threshold voltage so as to generate the sputtering.

In other words, since the plasma density near the target is higher than the plasma density near the substrate, the positive ions within the plasma discharge region should be supplied in diffusion toward the substrate without orientation, thereby failing to bombard the film on the wafer.

As described above, according to the film forming method according to the present invention, the direct bias voltage applied to the target is induced to be proportional to a peak voltage of the RF power, and the shield near the target is grounded. Also, the shield near the substrate becomes floated so as to restrict the plasma discharge to the adjacency of the target, so that the positive ions within the plasma are moved only by the diffusion toward the substrate and accelerated by the difference of the plasma potential and the substrate electrode, thereby preventing the film on the wafer from being bombarded during the process.

Further, the RF power is applied to the substrate electrode so as to induce the direct bias voltage, whereby the negative ions sputtered from the target are retarded by the potential barrier near the substrate for thereby preventing the film on the wafer from being bombarded.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A film forming method for an RF (radio frequency) sputtering apparatus including a vacuum chamber, a target mounted within the chamber and serving as a deposition object, a substrate facing against the target and mounted thereon by a wafer, a gas supply unit providing a process gas into the chamber, and a power supply unit providing an RF power, comprising:

floating shields adjacent to the substrate so that a plasma discharge region in accordance with the ionization of the process gas can be restricted to an adjacency to the target; and applying an RF power to the substrate and the RF power to the target to induce a self-bias voltage to the target and the substrate.

2. The method of claim 1, wherein the method further comprises:

decreasing pressure within and vaccumizing the chamber;

introducing the process gas into the chamber; and generating plasma by applying the RF power to the target and the substrate.

3. The method of claim 1, wherein the target is formed of one selected from a ceramic material, an insulation material, a chemical compound and a complex thereof.

4. The method of claim 1, wherein an absolute value of the self-bias voltage induced to the target is proportional to a peak voltage value of the RF power.

5. The method of claim 1, wherein a density of the plasma is higher near the target than near the substrate.

6. The method of claim 1, wherein an argon gas ($ArO_2$) is used for the process gas.

7. The method of claim 1, further comprising grounding a shield adjacent to the target.

8. The method of claim 7, wherein a voltage difference between the grounded shield and floated shield increases a plasma density in the chamber near the target and decreases the plasma density near the substrate.

9. The method of claim 8, wherein the decreased plasma density near the substrate reduces a resputtering effect by reducing a number of collisions on the substrate from charged ions of a type that are generated within the plasma and are attracted to the target by a potential difference between the target and the plasma.

10. The method of claim 10, wherein the charged ions are positive ions.

11. The method of claim 1, wherein the applied RF power only is supplied to each of the target and the substrate, and wherein the applied RF power is supplied by a single RF power supply.

12. A film forming method for an RF (radio frequency) sputtering apparatus including a vacuum chamber, a target mounted within the chamber and serving as a deposition object, a substrate facing against the target and mounted thereon by a wafer, a gas supply unit providing a process gas into the chamber, and a power supply unit providing an RF power, comprising:

floating a first shield adjacent to the substrate;

introducing the process gas into the chamber and generating plasma with an RF voltage; and inducing a self-bias voltage to the target and the substrate using only an RF power supply.

13. The method of claim 12, further comprising:

restricting a plasma discharge region in accordance with ionization of the process gas to an adjacency to the target; and grounding a second shield adjacent to the target, wherein a voltage difference between the second shield and the first shield increase a plasma density in the chamber near the target and decreases the plasma density near the substrate.

14. The method of claim 13, further comprising applying an identical RF power to each of the target and the substrate to generate the self-bias voltage to the target and the substrate; and wherein the first and second shields include portions on opposing sides of the substrate and the target, respectively.

15. The method of claim 12, wherein a density of the plasma is higher near the target than near the substrate.

16. The method of claim 12, further comprising applying only an identical RF power to generate the self-bias to the target and the substrate.

17. The method of claim 12, wherein the RF power supply supplies the RF voltage.

18. The method of claim 12, wherein the target is formed of one selected from a ceramic material, an insulation material, a chemical compound and a complex thereof, and wherein an absolute value of the self-bias voltage induced to the target is proportional to a peak voltage value of RF power.

* * * * *